United States Patent
Zerbe et al.

(10) Patent No.: US 11,630,788 B2
(45) Date of Patent: *Apr. 18, 2023

(54) CLOCK GENERATION FOR TIMING COMMUNICATIONS WITH RANKS OF MEMORY DEVICES

(71) Applicant: Rambus Inc., San Jose, CA (US)

(72) Inventors: Jared L. Zerbe, Woodside, CA (US); Ian P. Shaeffer, Los Gatos, CA (US); John Eble, Chapel Hill, NC (US)

(73) Assignee: RAMBUS INC., San Jose, CA (US)

( * ) Notice: Subject to any disclaimer, the term of this patent is extended or adjusted under 35 U.S.C. 154(b) by 295 days.

This patent is subject to a terminal disclaimer.

(21) Appl. No.: 16/921,061

(22) Filed: Jul. 6, 2020

(65) Prior Publication Data

US 2021/0049118 A1 Feb. 18, 2021

Related U.S. Application Data

(63) Continuation of application No. 16/228,695, filed on Dec. 20, 2018, now Pat. No. 10,705,990, which is a (Continued)

(51) Int. Cl.
*G06F 13/16* (2006.01)
*G11C 7/22* (2006.01)
(Continued)

(52) U.S. Cl.
CPC ............ *G06F 13/1689* (2013.01); *G06F 1/04* (2013.01); *G06F 1/06* (2013.01); *G06F 1/08* (2013.01);
(Continued)

(58) Field of Classification Search
CPC .......... G06F 13/1689; G06F 1/04; G06F 1/06; G06F 1/08; G06F 1/10; G06F 13/161;
(Continued)

(56) References Cited

U.S. PATENT DOCUMENTS 7,321,524 B2 1/2008 Shaeffer et al.
9,201,444 B2 12/2015 Zerbe et al.
(Continued)

OTHER PUBLICATIONS

International Search Report and Written Opinion dated Feb. 29, 2012 re Int'l Application No. PCT/US2011/059851. 12 pages.

*Primary Examiner* — Michael J Brown
(74) *Attorney, Agent, or Firm* — Morgan, Lewis & Bockius LLP

(57) ABSTRACT

A memory controller includes a clock generator to generate a first clock signal and a timing circuit to generate a second clock signal from the first clock signal. The second clock signal times communications with any of a plurality of memory devices in respective ranks, including a first memory device in a first rank and a second memory device in a second rank. The timing circuit is configured to adjust a phase of the first clock signal, when the memory controller is communicating with the second memory device, based on calibration data associated with the second memory device and timing adjustment data associated with feedback from at least the first memory device.

20 Claims, 13 Drawing Sheets

Related U.S. Application Data continuation of application No. 15/424,714, filed on Feb. 3, 2017, now Pat. No. 10,162,772, which is a continuation of application No. 14/954,940, filed on Nov. 30, 2015, now Pat. No. 9,563,228, which is a continuation of application No. 13/990,370, filed on May 29, 2013, now Pat. No. 9,201,444, which is a continuation of application No. PCT/US2011/059851, filed on Nov. 9, 2011.

(60) Provisional application No. 61/417,845, filed on Nov. 29, 2010.

(51) Int. Cl.

| | | |
|---|---|---|
| *G06F 1/10* | (2006.01) | |
| *G06F 1/06* | (2006.01) | |
| *G06F 1/08* | (2006.01) | |
| *G06F 1/04* | (2006.01) | |
| *G11C 7/04* | (2006.01) | |
| *H04L 7/033* | (2006.01) | |

(52) U.S. Cl.
CPC .............. *G06F 1/10* (2013.01); *G06F 13/161* (2013.01); *G06F 13/1657* (2013.01); *G11C 7/222* (2013.01); *G11C 7/04* (2013.01); *H04L 7/033* (2013.01)

(58) Field of Classification Search
CPC ....... G06F 13/1657; G11C 7/222; G11C 7/04; H04L 7/033
USPC .................................................. 713/500, 503
See application file for complete search history.

(56) References Cited

U.S. PATENT DOCUMENTS

| | | |
|---|---|---|
| 9,563,228 B2 | 2/2017 | Zerbe et al. |
| 10,162,772 B2 * | 12/2018 | Zerbe ................... G06F 13/161 |
| 2002/0141280 A1 | 10/2002 | Hamamoto et al. |
| 2003/0184343 A1 | 10/2003 | Kuge |
| 2005/0135167 A1 | 6/2005 | Manabe |
| 2007/0195491 A1 | 8/2007 | Honda |
| 2007/0260841 A1 | 11/2007 | Hampel et al. |
| 2008/0181348 A1 | 7/2008 | Best et al. |
| 2010/0202233 A1 | 8/2010 | Hirobe |

* cited by examiner

700

702
At a memory controller coupled to memory devices in a plurality of ranks, including a first memory device in a first rank and a second memory device in a second rank:

704
Generate a first clock signal.

706
Generate a first plurality of phase vectors.

708
Adjust a phase of the first clock signal to generate a second clock signal, based on calibration data associated with the second memory device and timing adjustment data associated with feedback from at least the first memory device.

710
The feedback includes feedback from the first and second memory devices.

712
Time communications with the second memory device, in accordance with the second clock signal.

714
Clock a transmitter transmitting data to the second memory device with the second clock signal.

716
Clock a sampling circuit receiving data from the second memory device with the second clock signal.

Figure 7A

CLOCK GENERATION FOR TIMING COMMUNICATIONS WITH RANKS OF MEMORY DEVICES

RELATED APPLICATIONS

This application is a continuation of U.S. patent application Ser. No. 16/228,695, filed Dec. 20, 2018, which is a continuation of U.S. patent application Ser. No. 15/424,714, filed Feb. 3, 2017, now U.S. Pat. No. 10,162,772, which is a continuation of U.S. patent application Ser. No. 14/954,940, filed Nov. 30, 2015, now U.S. Pat. No. 9,563,228, which is a continuation of U.S. patent application Ser. No. 13/990,370, filed May 29, 2013, now U.S. Pat. No. 9,201,444, which was a U.S. National Stage Application filed under 35 U.S.C. § 371 of PCT Patent Application No. PCT/US2011/059851, filed Nov. 9, 2011, which claims priority to U.S. Provisional Patent Application No. 61/417,845, filed Nov. 29, 2010, which are hereby incorporated by reference in their entireties.

TECHNICAL FIELD

The disclosed embodiments relate generally to data communications between memory controllers and memory devices, and more particularly, to generating clock signals for timing data communications between a memory controller and memory devices.

BACKGROUND

The timing of data communications between a memory controller and memory devices presents significant engineering challenges. For example, voltage and temperature variation during operating can cause a previous calibration to become obsolete. Frequent calibrations, however, cause system delays. Also, inclusion of a PLL or DLL on the memory devices is not desirable, due to power, die area, and system delay issues.

BRIEF DESCRIPTION OF THE DRAWINGS

FIGS. 7A-7D are flow diagrams illustrating methods of controlling memory devices in accordance with some embodiments.

Like reference numerals refer to corresponding parts throughout the drawings.

DESCRIPTION OF EMBODIMENTS

Figure 1A:
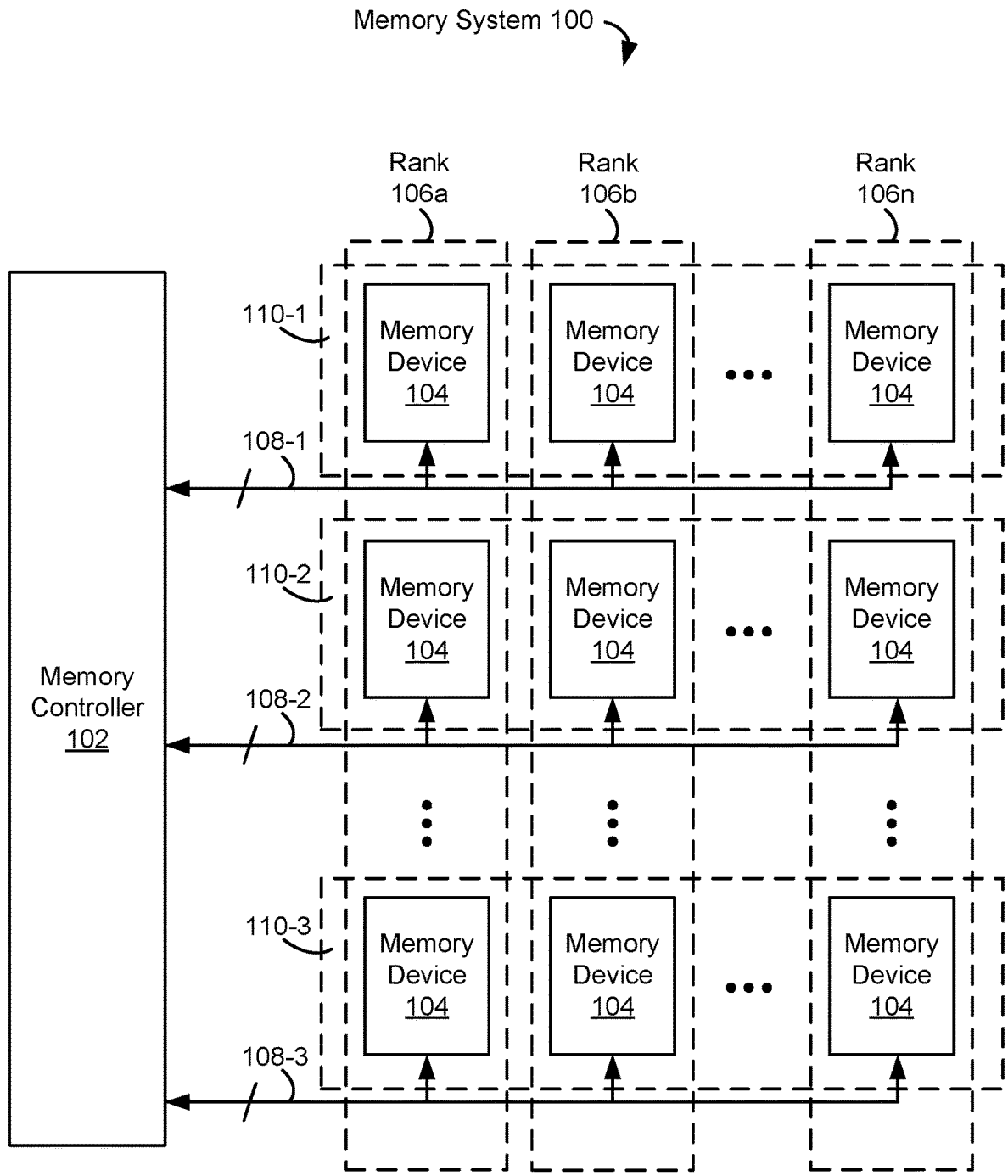
FIG. 1A-1C are block diagrams illustrating memory systems that include a memory controller and memory devices arranged in ranks, in accordance with some embodiments.

In some embodiments, a memory controller includes a clock generator to generate a first clock signal and a timing circuit to generate a second clock signal from the first clock signal. The second clock signal times communications with any of a plurality of memory devices in respective ranks, including a first memory device in a first rank and a second memory device in a second rank. The timing circuit is configured to adjust a phase of the first clock signal, when the memory controller is communicating with the second memory device, based on calibration data associated with the second memory device and timing adjustment data associated with feedback from at least the first memory device.

In some embodiments, a memory controller includes a clock generator to generate a first clock signal and a timing circuit to generate a second clock signal from the first clock signal. The second clock signal times communications with any of a plurality of memory devices in respective ranks, including a first memory device in a first rank and a second memory device in a second rank. The timing circuit includes a first phase adjuster to generate an intermediate clock signal by adjusting a phase of the first clock signal; a plurality of respective storage elements, each to store calibration data associated with a respective memory device in a respective rank and configured to be selectively coupled to the first phase adjuster when the memory controller is to communicate with the respective memory device in the respective rank; and a second phase adjuster to generate the second clock signal by adjusting a phase of the intermediate clock signal based on timing adjustment data associated with feedback from one or more of the plurality of memory devices in the respective ranks. The first phase adjuster is configured to adjust the phase of the first clock signal based on the calibration data stored in the selectively coupled storage element.

In some embodiments, a memory controller includes a clock generator to generate a first clock signal and a first phase adjuster to generate a second clock signal by adjusting a phase of the first clock signal. The second clock signal times communications with any of a plurality of memory devices in respective ranks. The memory controller also includes a plurality of respective storage elements, each to store calibration data associated with a respective memory device in a respective rank and configured to be selectively coupled to the first phase adjuster when the memory controller is to communicate with the respective memory device in the respective rank. The first phase adjuster is configured to adjust the phase of the first clock signal based on the calibration data stored in the selectively coupled storage element. The memory controller also includes calibration circuitry to perform calibration for a first memory device in a first rank and, in response, to determine an amount by which to adjust calibration data associated with the first memory device in a first storage element of the plurality of storage elements. The memory controller further includes adjustment circuitry to adjust calibration data associated with the second memory device in a second storage element of the plurality of respective storage elements by the determined amount.

In some embodiments, a method of controlling memory devices is performed at a memory controller coupled to memory devices in a plurality of ranks, including a first memory device in a first rank and a second memory device in a second rank. The method includes generating a first clock signal and adjusting a phase of the first clock signal to generate a second clock signal. The phase of the first clock signal is adjusted based on calibration data associated with the second memory device and timing adjustment data associated with feedback from at least the first memory device. The method also includes timing communications with the second memory device, in accordance with the second clock signal.

In some embodiments, a method of controlling memory devices is performed at a memory controller coupled to memory devices in a plurality of ranks, including a first memory device in a first rank and a second memory device in a second rank. The method includes performing a calibration of first timing for communication between the memory controller and the first memory device and performing a calibration of second timing for communication between the memory controller and the second memory device. The method also includes communicating with the first memory device in accordance with the first timing and, while communicating with the first memory device, determining timing adjustments based on feedback from the first memory device and modifying the first timing based on the timing adjustments. The method further includes communicating with the second memory device in accordance with the second timing as modified by the timing adjustments and, while communicating with the second memory device, determining additional timing adjustments based on feedback from the second memory device and modifying the second timing based on the additional timing adjustments.

In some embodiments, a memory system includes a plurality of memory devices in respective ranks, including a first memory device in a first rank and a second memory device in a second rank. The memory system also includes a memory controller that includes a clock generator to generate a first clock signal and a timing circuit to generate a second clock signal from the first clock signal. The second clock signal times communications with any of the plurality of memory devices. The timing circuit is configured to adjust a phase of the first clock signal, when the memory controller is communicating with the second memory device, based on calibration data associated with the second memory device and timing adjustment data associated with feedback from at least the first memory device.

Reference will now be made in detail to various embodiments, examples of which are illustrated in the accompanying drawings. In the following detailed description, numerous specific details are set forth in order to provide a thorough understanding of the present inventions. However, the present inventions may be practiced without these specific details. In other instances, well-known methods, procedures, components, and circuits have not been described in detail so as not to unnecessarily obscure aspects of the embodiments.

FIG. 1A is a block diagram illustrating a memory system 100 in accordance with some embodiments. The memory system 100 includes a memory controller 102 coupled to a plurality of memory devices 104, which are arranged in ranks 106a through 106n as shown. In some embodiments, the memory system 100 includes only two ranks 106 (e.g., ranks 106a and 106b). In some embodiments, the memory system 100 includes three ranks 106, or four ranks 106 or more.

A first collection of signal lines 108-1, referred to as a lane 108-1, couples the memory controller 102 to a first memory device 104 in each of the ranks 106a through 106n. The lane 108-1 includes signal lines for transferring data, referred to as data lines, between the memory controller 102 and the memory devices 104 that are coupled to the lane 108-1. The memory devices 104 coupled to the lane 108-1 are referred to as a slice 110-1. The number of data lines in the lane 108-1 equals the width of each memory device 104, where the term width refers to the number of bits in data words written to and read from the memory device 104. For example, if each memory device 104 is ×8 ("by 8"), meaning that its data words have eight bits, then the lane 108-1 includes eight signal lines for transferring data between the memory controller 102 and memory devices 104; such a lane 108-1 is referred to as a byte lane. In another example, each memory device 104 is ×4 ("by 4"), meaning that its data words have four bits, and the lane 108-1 includes four signal lines for transferring data between the memory controller 102 and memory devices 104; such a lane 108-1 is referred to as a nibble lane. Other widths and corresponding numbers of data lines in the lane 108-1 are possible.

In some embodiments, the lane 108-1 includes other signal lines in addition to the data lines. For example, the lane 108-1 may include one or more additional signal lines for transmitting data strobes associated with the data. The lane 108-1 also includes one or more signal lines for providing feedback from the memory devices 104 to the memory controller 102. For example, the lane 108-1 includes a signal line for transmitting an error detection code (EDC) signal from the memory devices 104 to the memory controller 102. Optionally, feedback is provided by strobe signals (e.g., read strobes) from the memory devices 104.

Additional lanes 108 couple the memory controller 102 to additional respective memory devices 104 in each of the ranks 106a through 106n, as described for the lane 108-1. For example, the lane 108-2 couples the memory controller 102 to a slice 110-2 that includes a second respective memory device 104 in each of the ranks 106a through 106n, and the lane 108-3 couples the memory controller 102 to a slice 110-3 that includes a third respective memory device 104 in each of the ranks 106a through 106n. Furthermore, the memory system 100 includes additional signal lines (not shown) between the memory controller 102 and memory devices 104 including, for example, clock lines to transmit clock signals from the memory controller 102 to the memory devices 104 and signal lines (e.g., C/A busses) to transmit command and address information from the memory controller 102 to the memory devices 104.

At any given time during operation of the memory system 100, one of the ranks 106a through 106n may be selected and the other ranks deselected. (Alternatively, all ranks 106a through 106n are deselected, and the system 100 is in a standby or power-down mode in which no communication of data occurs between the memory controller 102 and memory devices 104.) The memory controller 102 writes data to and reads data from the memory devices 104 in the selected rank 106 and not the memory devices 104 in the deselected ranks 106. For example, for memory devices 104 in deselected ranks 106, the input/output pins coupled to the lanes 108 are tristated. (The term pin as used herein includes pins as well as solder balls, lands, and other contacts on an appropriate semiconductor package.). The memory controller 102 switches between ranks 106 by deselecting the selected rank 106 (e.g., rank 106a) and selecting a new rank (e.g., rank 106b). After performing this switch, the memory controller 102 writes data to and reads data from the memory devices 104 in the newly selected rank 106 (e.g., rank 106b) and not the memory devices 104 in the deselected ranks (e.g., rank 106a and any other ranks).

Switching between ranks presents challenges for calibration and timing. While inclusion of a delay-locked loop (DLL) or phase-locked loop (PLL) on each of the memory devices 104 can at least partially resolve timing issues, inclusion of a DLL or PLL on the devices 104 is not desirable. DLLs and PLLs consume more power than is desirable for low-power applications. While DLLs or PLLs of memory devices 104 in deselected ranks 106 can be powered down, they require time to power up and lock when their rank 106 is selected, resulting in system delays. Thus, in some embodiments, the memory devices 104 include neither DLLs nor PLLs.

To account for timing variation resulting from process variation (i.e., variation in the manufacturing process) between memory devices 104 in respective ranks 106 in a slice 110, the memory system 100 performs a rank-specific calibration for each rank 106 and stores calibration data for each memory device 104 that is subsequently used to time communications (e.g., reads or writes) with respective memory devices 104. This calibration data may not be sufficient to provide adequate timing margins, however, because of voltage and temperature changes over time. For example, the voltage(s) supplied to memory devices 104 in a rank 106 and the temperatures of the memory devices 104 in the rank 106 may drift in the time between calibration of the rank 106 and communication between the memory controller 102 and the rank 106, resulting in a loss of timing margin and thus failed communication.

To account for voltage and temperature variation, timing of communications between the memory controller 102 and devices 104 in a selected rank 106 is adjusted based on feedback received from the devices 104 as well as on calibration data for the devices 104. Furthermore, in some embodiments, the devices 104 in respective ranks 106 in a given slice 110 are situated in physical proximity, such that they experience substantially the same voltage and temperature variation. In these embodiments, timing adjustments based on feedback from a first device 104 in a first rank 106 may be applied to communications with a second device 104 situated in a second rank 106 in the same slice 110 as the first device 104: the feedback from the first device 104 provides information about voltage and temperature variation experienced by both the first and second devices 104, because of the physical proximity of the first and second devices 104. Thus, in some embodiments, when the controller 102 deselects a first rank 106 and selects a second rank 106, communications with the second rank 106 are timed using both calibration data for devices 104 in the second rank 106 and feedback previously received from devices 104 in the first rank 106, as well as feedback newly received from devices 104 in the second rank 106.

Figure 1B:
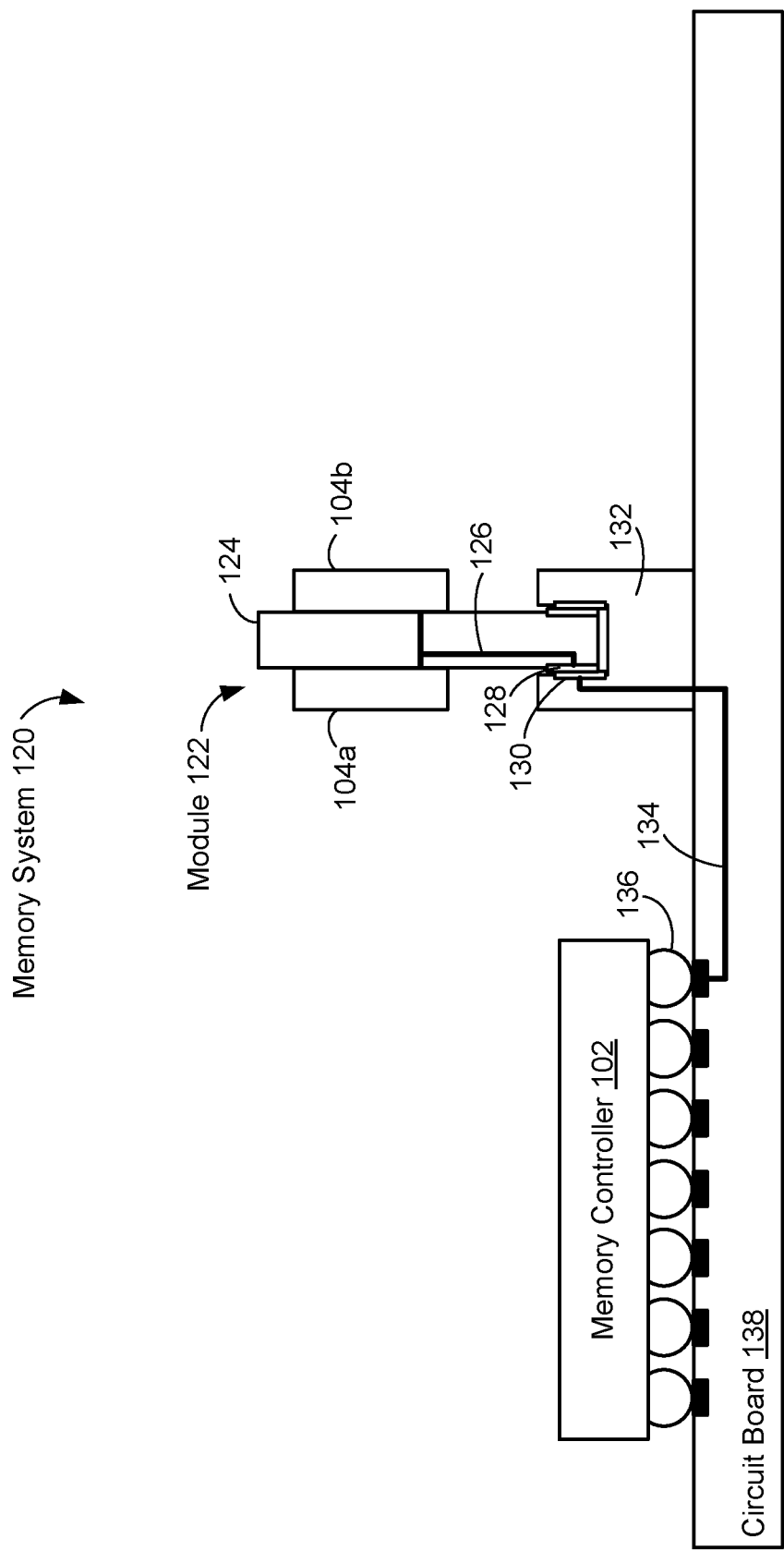

FIG. 1B is a cross-sectional view of a memory system 120 in which memory devices 104 in respective ranks 106 in a slice 110 are located in physical proximity such that they experience substantially the same voltage and temperature variation. The memory system 120, which is an example of the memory system 100 (FIG. 1A), includes a memory module 122 coupled to a memory controller 102. The memory module 122 includes a first memory device 104a connected to a first side of a card 124 and a second memory device 104b connected to a second side of the card 124. The first memory device 104a is part of a first rank 106 (e.g., 106a, FIG. 1A) of memory devices 104 on the first side of the card 124 and the second memory device 104b is part of a second rank 106 (e.g., 106b, FIG. 1A) of memory devices 104 on the second side of the card 124. The system 120 thus includes two ranks 106 of memory devices 104. The first and second memory devices 104a and 104b are situated back-to-back on the module 122 and thus are in close physical proximity.

A socket 132 connects the module 122 to a circuit board 138, to which the memory controller 102 also is connected. A signal line 134 in the circuit board 138 and a signal line 126 in the module 122 together constitute a data line that connects data pins (not shown) on the memory devices 104a and 104b to a data pin 136 (shown as a solder ball) on the controller 102. A contact 130 in the socket 132 and a contact 128 on the card 124 connect the signal line 134 to the signal line 126, as shown. The data line formed by the signal lines 134 and 126 is part of a lane 108 (e.g., lane 108-1, FIG. 1); the memory devices 104a and 104b are thus in the same slice 110 (e.g., slice 110-1, FIG. 1).

Figure 1C:
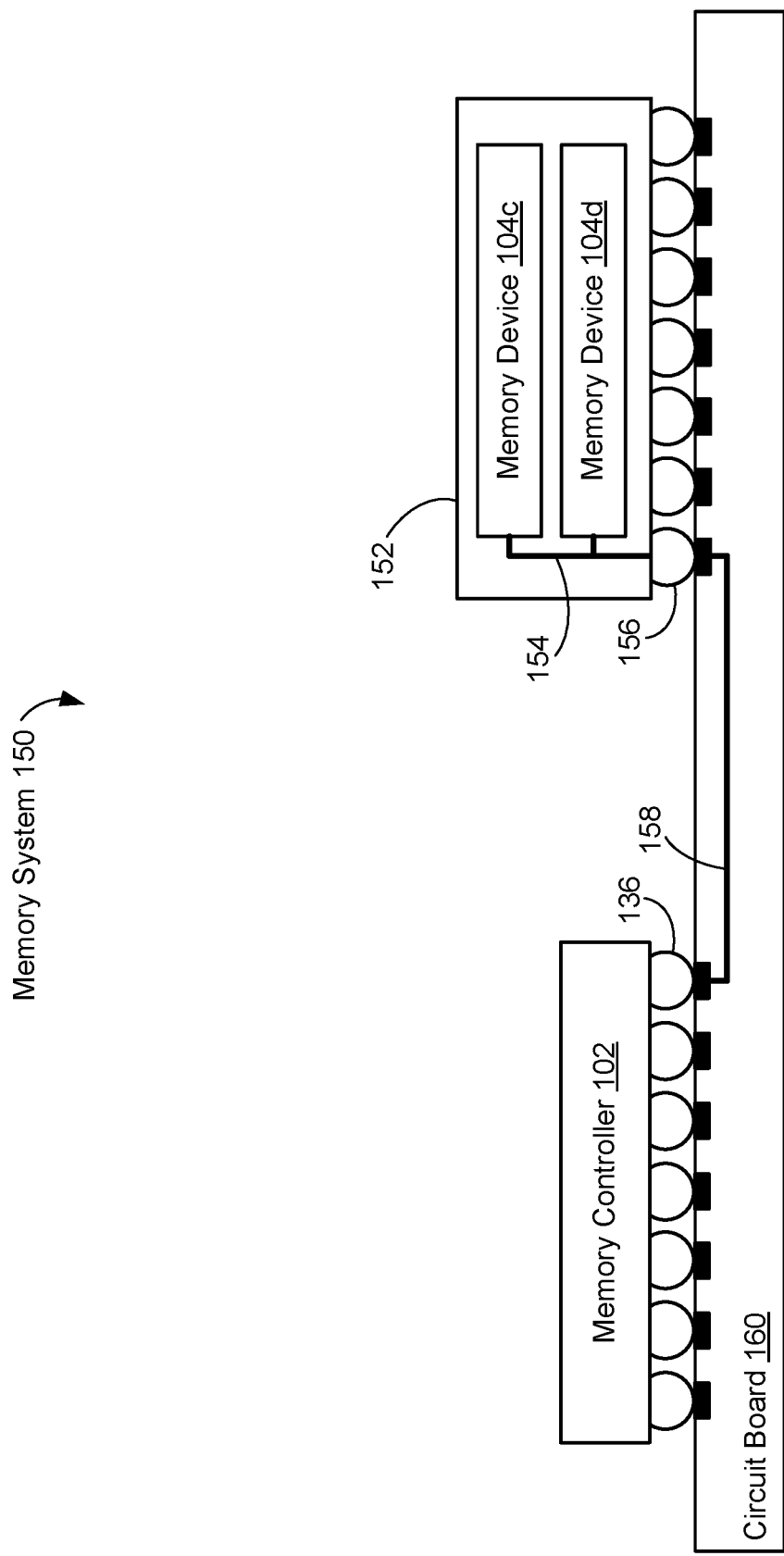

FIG. 1C illustrates a cross-sectional view of another memory system 150 in which memory devices 104 in respective ranks 106 in a slice 110 are located in physical proximity such that they experience substantially the same voltage and temperature variation. The memory system 150 is another example of the memory system 100 (FIG. 1A). In the system 150, semiconductor package 152 contains two memory devices 104c and 104d in a stacked configuration. The package 152, also referred to as a multi-chip module 152, is coupled to a memory controller 102 via a circuit board 160, to which the package 152 and controller 102 are connected. The first memory device 104c is part of a first rank 106 (e.g., 106a, FIG. 1A) of memory devices 104 and the second memory device 104d is part of a second rank 106 (e.g., 106b, FIG. 1A) of memory devices 104. For example, the system 150 includes multiple packages 152, each of which includes a memory device 104 in each of the respective ranks. The package 152 is shown with two stacked memory devices 104c and 104d, and the system 150 is correspondingly shown as having two ranks 106 of memory devices 104. In some embodiments, however, the package 152 includes more than two stacked memory devices 104 (e.g., includes three or four stacked memory devices 104) and the system 150 correspondingly includes more than two ranks 106 (e.g., includes three or four ranks 106).

A signal line 158 in the circuit board 160 and a signal line 154 in the package 152, connected via a pin 156 on the package 152, together constitute a data line that connects data pads (not shown) on the memory devices 104c and 104d (which in this example are dice housed in the package 152, as opposed to the packaged devices 104a and 104b of FIG. 1B) to the data pin 136 on the controller 102. The data line formed by the signal lines 158 and 154 is part of a lane 108 (e.g., lane 108-1, FIG. 1); the memory devices 104c and 104d are thus in the same slice 110. In some embodiments, the signal line 154 in the package 152 is implemented, at least in part, using through-silicon via technology.

Figure 2A:
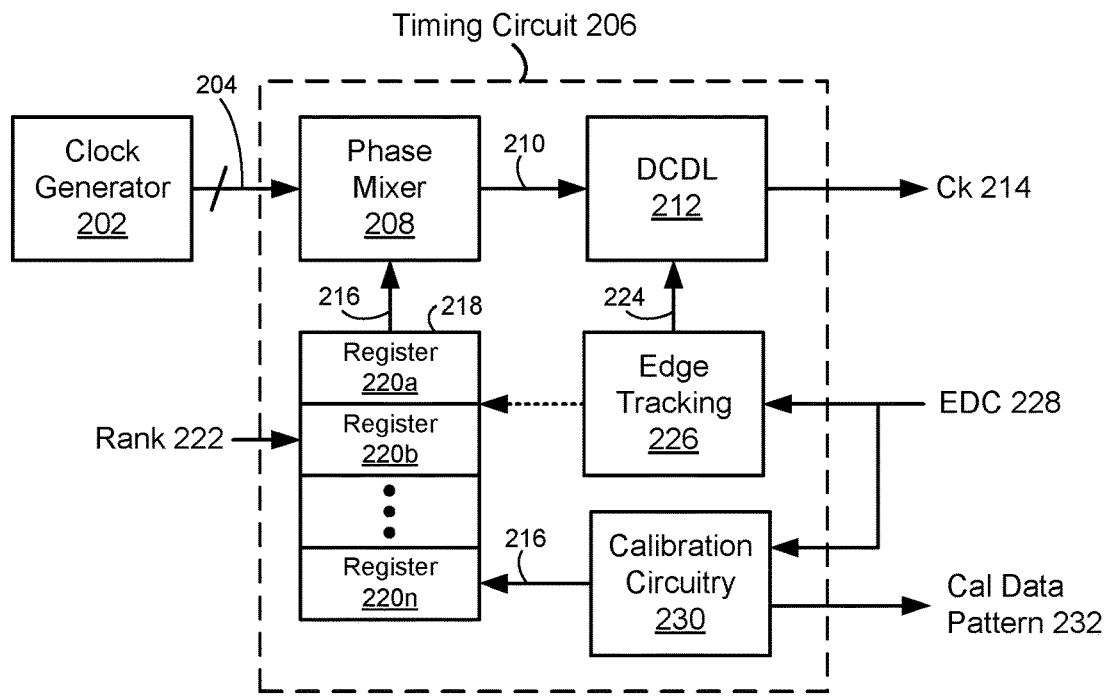
FIGS. 2A-2C are block diagrams illustrating circuitry in a memory controller for timing communications with memory devices in accordance with some embodiments.

Attention is now directed to circuitry in the memory controller 102 for timing communications (e.g., reads and writes) with memory devices 104. In FIG. 2A, a clock generator 202 generates a first clock signal 204 that includes a plurality of phase vectors (e.g., evenly spaced phase vectors). A timing circuit 206 receives the first clock signal 204 and generates a second clock signal ("Ck") 214 from the first clock signal 204 by adjusting the phase of the first clock signal 204. The memory controller 102 uses the second clock signal 214 to time communications with memory devices 104, as explained below, for example, with respect to FIGS. 3A-3B.

Specifically, the clock generator 202 provides the first clock signal 204 to a phase mixer 208 in the timing circuit 206. The phase mixer 208 is coupled to a plurality of storage elements 218, each of which includes a respective one of a plurality of registers 220a through 220n, where n is an integer corresponding to the number of ranks 106 in the system 100 (FIG. 1A). Each register 220 stores calibration data 216 for a memory device 104 in a corresponding rank 106; the memory devices for which the registers 220 store calibration data 216 are all in the same slice 110. For example, the register 220a stores calibration data for a memory device 104 (e.g., 104a, FIG. 1B, or 104c, FIG. 1C) in the rank 106a and the register 220b stores calibration data for a memory device 104 (e.g., 104b, FIG. 1B, or 104d, FIG. 1C) in the rank 106b, with both memory devices being situated in the same slice 110 (e.g., slice 110-1, on the lane 108-1). When the memory controller 102 selects one of the ranks 106 and communicates with memory devices 104 in the selected rank, it provides a signal specifying the selected rank 222 to the plurality of storage elements 218. In response, the register 220 corresponding to the selected rank 222 is coupled to the phase mixer 208 and the calibration data 216 stored in the register 220 corresponding to the selected rank 222 is provided to the phase mixer 208, which adjusts the phase of the first clock signal 204 in accordance with the calibration data 216 for the selected rank 222 and thereby generates an intermediate clock signal 210. Each of the registers 220a through 220n thus can be selectively coupled to the phase mixer 208. The calibration data 216 serves as an input to the phase mixer 208 to specify the amount by which to adjust the phase of the first clock signal 204 (e.g., by specifying how to mix phase vectors of the first clock signal 204).

The phase mixer 208 provides the intermediate clock signal 210 to a digitally controlled delay line (DCDL) 212, which adjusts the phase of the intermediate clock signal 210 by delaying the intermediate clock signal 210 by a programmable amount. The output of the DCDL 212 is the second clock signal 214, which the memory controller 102 uses to time communications with a memory device 104 in the selected rank 222 (e.g., as described below with respect to FIGS. 3A and 3B). The amount by which the DCDL 212 delays the intermediate clock signal 210 is determined by timing adjustment data 224 received from edge tracking circuitry 226, which generates the timing adjustment data 224 based on feedback received from memory devices 104 in a slice 110. The timing adjustment data 224 is thus derived from the feedback. In some embodiments, the feedback is provided by an EDC signal 228 transmitted over a dedicated signal line of the lane 108. At any given time, the feedback is received from the memory device 104, situated in the slice 110, which is in the selected rank 106. In some embodiments, when the memory controller switches the selected rank 106, the edge tracking circuitry 226 continues to receive feedback (e.g., the EDC signal 228) with no delays beyond those associated with switching ranks 106. The edge tracking circuitry 226 is implemented using clock-and-data-recovery (CDR) logic, an example of which is described below with respect to FIG. 5.

In some embodiments, the edge tracking circuitry 226 is coupled to the plurality of storage elements 218 and provides timing adjustment data to the storage elements 218 to update the calibration data, as described below with respect to FIGS. 4A and 4B. For example, the edge tracking circuitry 226 accumulates the timing adjustment data 224 and periodically provides the accumulated timing adjustment data 224 to the storage elements 218 as periodic updates to the calibration data.

Figure 2B:
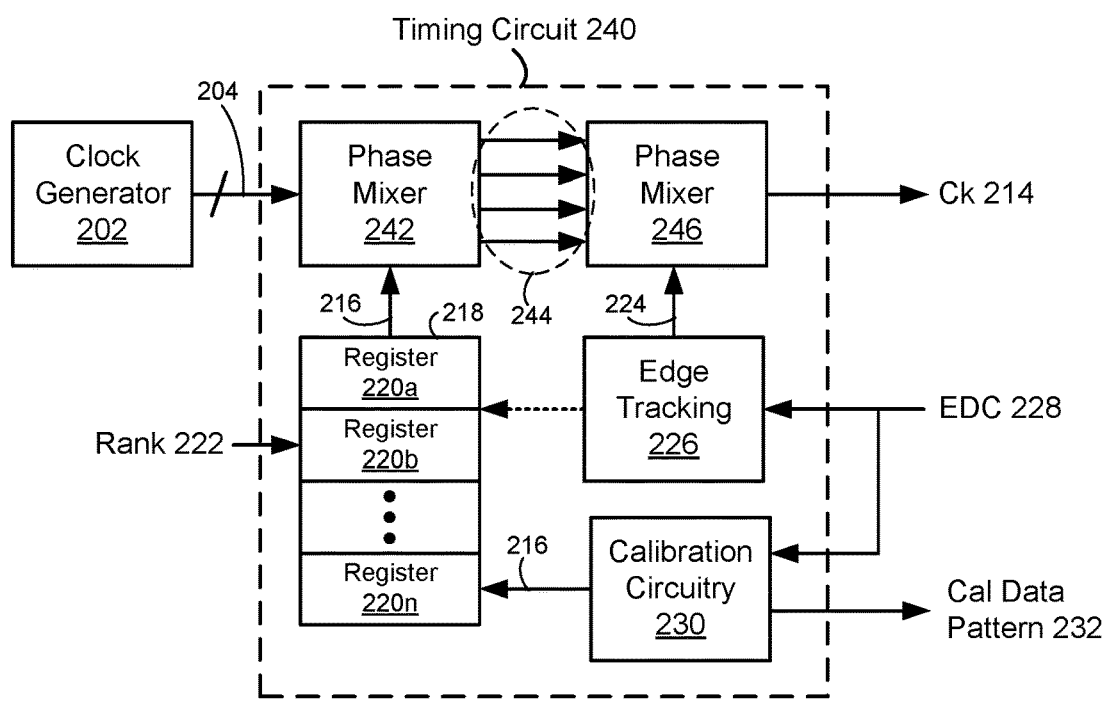

In some embodiments, the DCDL 212 is replaced with a second phase mixer 246, as illustrated for the timing circuit 240 in FIG. 2B. Also, the phase mixer 208 is replaced with a phase mixer 242 that provides a plurality of phase vectors 244 (e.g., evenly spaced phase vectors) as the intermediate clock signal. The second phase mixer 246 receives the phase vectors 244 and mixes them, in accordance with the timing adjustment data 224, to produce the second clock signal 214.

The timing circuit 206 (FIG. 2A) or 240 (FIG. 2B) includes calibration circuitry 230 that generates the calibration data 216 stored in the registers 220. For example, when the memory controller 102 enters a calibration mode, the calibration circuitry 230 transmits a calibration data pattern 232 to a memory device 104 in a selected rank 106, determines the calibration data 216 for the memory device 104 based on feedback from the memory device 104 (e.g., based on the EDC signal 228), stores the calibration data 216 in the corresponding register 220, and repeats the process for each rank 106 and corresponding register 220.

In some embodiments, the memory controller 102 includes an instance (i.e., a separate instance) of the timing circuit 206 (FIG. 2A) or 240 (FIG. 2B) for each lane 108 in the system 100. Alternatively, the memory controller 102 includes an instance of the timing circuit 206 (FIG. 2A) or 240 (FIG. 2B) for each data line in each lane 108, or for a subset of the data lines in each lane 108. In other alternatives, the memory controller 102 includes respective instances of the phase mixer 208 or 242, the DCDL 212 or phase mixer 246, and the registers 220a through 220n for each data line in each lane 108, and includes a single instance of the edge tracking circuitry 226 and calibration circuitry 230 for each lane 108.

The timing circuits 206 (FIG. 2A) and 240 (FIG. 2B) thus allow the memory controller 102 to time communications with a respective memory device 104 based on calibration data 216 for the respective memory device 104 as well as feedback received from the respective memory device 104 and potentially from one or more other memory devices 104. For example, when the memory controller 102 switches from communicating with a first memory device 104 in a first rank 106 to communicating with a second memory device 104 in a second rank 106 (e.g., by deselecting the first rank 106 and selecting the second rank 106), the memory controller 102 times initial communications with the second memory device 104 based on the calibration data 216 from the register 220 corresponding to the second memory device 104 and also on the timing adjustment data 224 that the edge tracking circuitry 226 generated based on the feedback received from the first memory device 104. As communications with the second memory device 104 continue, the edge tracking circuitry 226 will update the timing adjustment data 224 based on newly-received feedback from the second memory device 104, such that the timing adjustment data 224 is now based on feedback from both the first and second memory devices 104. In some embodiments in which the system 100 includes three or more ranks 106, sufficiently rapid switching between ranks 106 results in the timing adjustment data 224 being based on feedback from at least three of the ranks 106, or from all of the ranks 106.

Figure 2C:
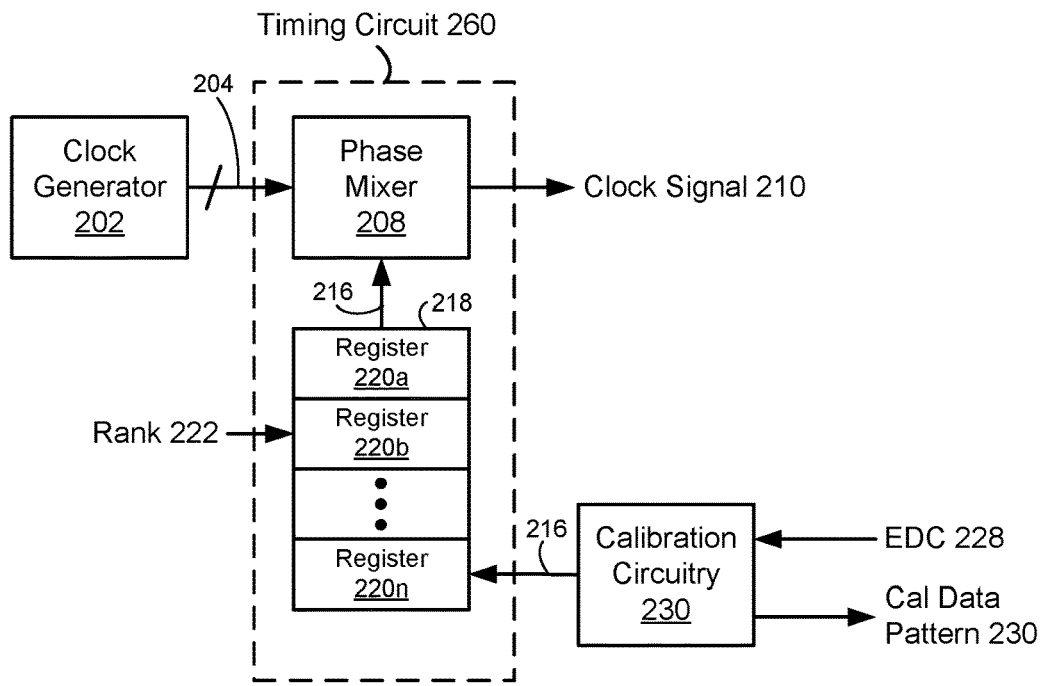

The timing circuits 206 (FIG. 2A) and 240 (FIG. 2B) perform two-stage phase adjustment of the first clock signal 204, with the phase mixers 208 or 242 being a first stage and the DCDL 212 or phase mixer 246 being a second stage. In some embodiments, however, timing circuitry 260 performs single-stage phase adjustment of the first clock signal 204, as illustrated in FIG. 2C. The timing circuitry 260 omits the DCDL 212 (FIG. 2A) and phase mixer 246 (FIG. 2B). Instead, the clock signal 210 provided by the phase mixer 208 is used to time communications with memory devices 104. In some embodiments, in addition to generating calibration data 216, the calibration circuitry 230 generates timing adjustment data, analogous to the timing adjustment data 224 generated by the edge tracking circuitry 226 (FIGS. 2A-2B), and periodically adjusts the calibration data stored in the registers 220 based on the timing adjustment data.

Figure 3A:
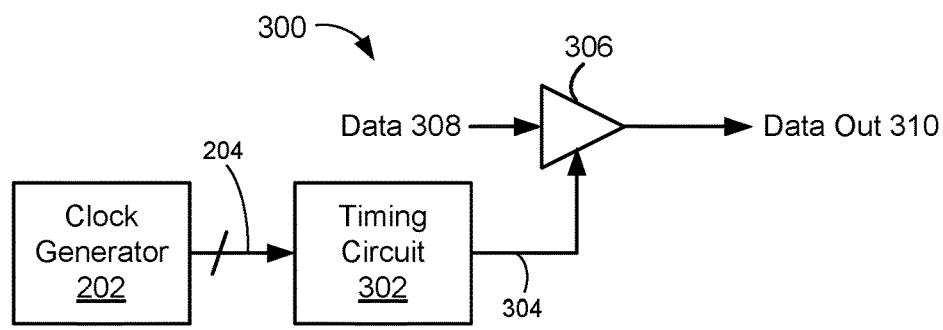
FIG. 3A is a circuit diagram illustrating circuitry in a memory controller for timing data transmission to memory devices in respective ranks, in accordance with some embodiments.

FIG. 3A is a circuit diagram illustrating circuitry 300 in a memory controller 102 for timing data transmission to memory devices 104 in respective ranks 106 in a slice 110, in accordance with some embodiments. In the circuitry 300, a transmitter 306 receives data 308 and transmits it as output data ("Data Out") 310. The transmitter 306 is connected to a data line of a lane 108 and transmits the output data 310, via the data line, to any of the memory devices 104 in respective ranks 106 in the slice 110 corresponding to the lane 108. The transmitter 306 is synchronized to a clock signal 304 (e.g., Ck 214, FIGS. 2A-2B, or clock signal 210, FIG. 2C) provided by a timing circuit 302, examples of which include the timing circuits 206 (FIG. 2A), 240 (FIG. 2B), and 260 (FIG. 2C). The timing circuit 302 receives a first clock signal 204 from the clock generator 202, as described above with respect to FIGS. 2A-2C.

Figure 3B:
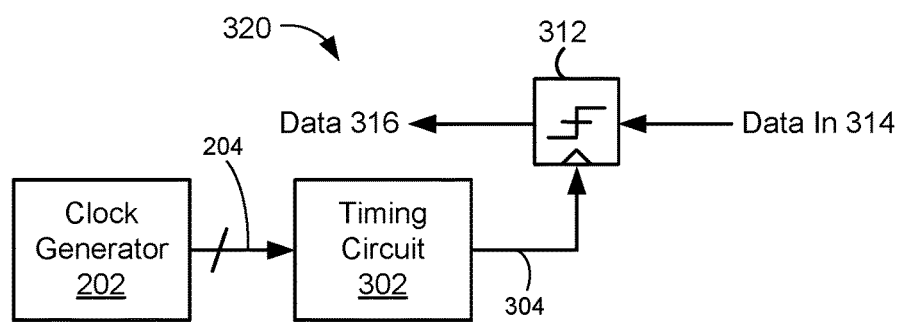
FIG. 3B is a circuit diagram illustrating circuitry in a memory controller for timing the receipt of data from memory devices in respective ranks, in accordance with some embodiments.

FIG. 3B is a circuit diagram illustrating circuitry 320 in a memory controller 102 for timing the receipt of data from memory devices 104 in respective ranks 106, in accordance with some embodiments. In the circuitry 320, a sampling circuit 312 samples input data ("Data In") 314 and provides the sampled data 316 to other circuitry in the memory controller 102 for processing. The sampling circuit 312 is connected to a data line of a lane 108 and receives the input data 314, via the data line, from any of the memory devices 104 in respective ranks 106 in the slice 110 corresponding to the lane 108. The sampling circuit 312 is synchronized to a clock signal 304 (e.g., Ck 214, FIGS. 2A-2B, or clock signal 210, FIG. 2C) provided by a timing circuit 302, examples of which include the timing circuits 206 (FIG. 2A), 240 (FIG. 2B), and 260 (FIG. 2C). The timing circuit 302 receives a first clock signal 204 from the clock generator 202, as described above with respect to FIGS. 2A-2C.

Figure 4A:
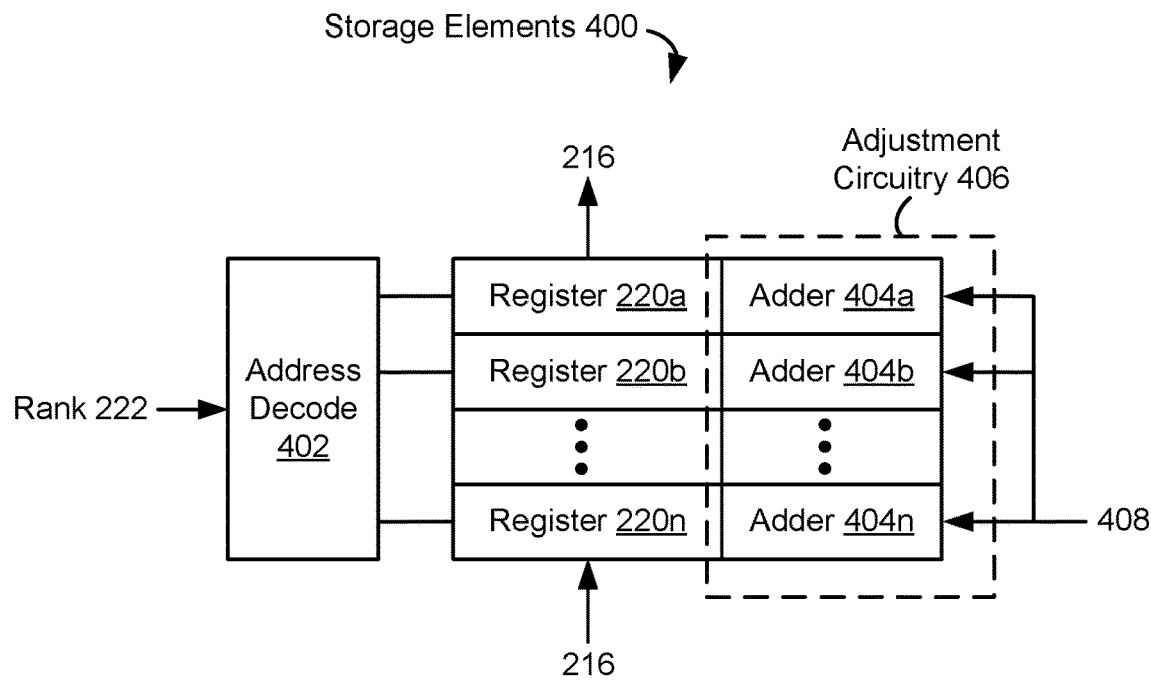
FIGS. 4A and 4B are block diagrams illustrating a plurality of storage elements for storing calibration data in accordance with some embodiments.

FIG. 4A is a block diagram illustrating a plurality of storage elements 400 for storing calibration data in accordance with some embodiments. The plurality of storage elements 400 is an example of the plurality of storage elements 218 (FIGS. 2A-2C). As described with respect to FIGS. 2A-2C, the plurality of storage elements 400 includes registers 220a through 220n, each corresponding to a respective rank 106. Calibration data 216 (e.g., as received from the calibration circuitry 230, FIGS. 2A-2C) for memory devices 104 in the respective ranks 106a through 106n are stored in the corresponding registers 220a through 220n. The specified rank 222 (e.g., the rank that is currently selected by the memory controller 102) is provided to an address decoder 402, which selects the corresponding register 220. The corresponding register 220 is thereby selectively coupled to the phase mixer 208 (FIGS. 2A and 2C) or 242 (FIG. 2B) and provides its calibration data 216 to the phase mixer 208 or 242. Coupled to each register 220a through 220n is an adder 404a through 404n, which together constitute adjustment circuitry 406 used to update the calibration data 216 stored in the registers 220a through 220n. The calibration data 216 is updated, for example, to account for voltage and temperature drift since the most recent calibration. In some embodiments in which memory devices 104 in respective ranks in the same slice 110 are situated in physical proximity such that they experience substantially the same voltage and temperature drift, the same update 408 is applied to the calibration data for each of the registers 220: because the update 408 accounts for voltage and temperature drift, and the memory devices 104 that correspond to the registers 220 experience substantially the same voltage and temperature drift, the same update 408 may be used for all of the registers 220. As shown in FIG. 4A, the same update 408 is provided to each of the adders 404, each of which adds the update 408 to the calibration data 216 in the corresponding register 220. In some embodiments, the update 408 is generated by accumulating timing adjustment data based on feedback from one or more memory devices 104 and is provided to the plurality of storage elements 400 by the calibration circuitry 230 (FIGS. 2A-2C), or alternatively by the edge tracking circuitry 226 (FIGS. 2A-2B).

Figure 4B:
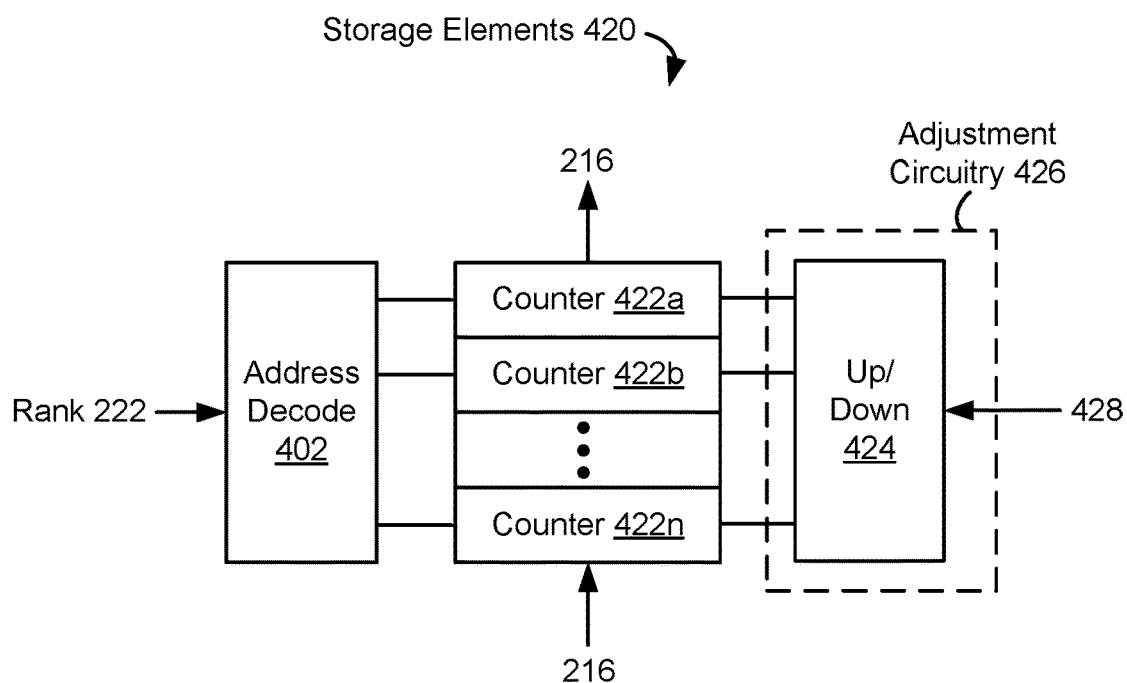

FIG. 4B is a block diagram illustrating a plurality of storage elements 420 for storing calibration data in accordance with other embodiments. The plurality of storage elements 400 is another example of the plurality of storage elements 218 (FIGS. 2A-2C). In the example of FIG. 4B, the registers 220a through 220n are replaced with counters 422a through 422n. An update 428 (e.g., based on timing adjustment data from the edge tracking circuitry 226 or calibration circuitry 230) is provided to the storage elements 400 in the form of up/down data that specifies how much to increment or decrement each of the counters 422. Alternatively, update 428 specifies only whether to increment by one, or decrement by one, the value in each of the counters 422. In yet another alternative, update 428 has a value selected from the set consisting of −1, 0 and +1, and thus specifies whether to decrement by one, leave unchanged, or increment by one, the values in each of the counters 422. Up/down circuitry 424 receives the update 428 and increments or decrements the counters 422 accordingly. As in FIG. 4A, the calibration data 216 for each of the memory devices 104 in a slice 110 are adjusted by the same amount based on the same update 428, which is determined based on feedback from one or more of the memory devices 104.

Figure 5:
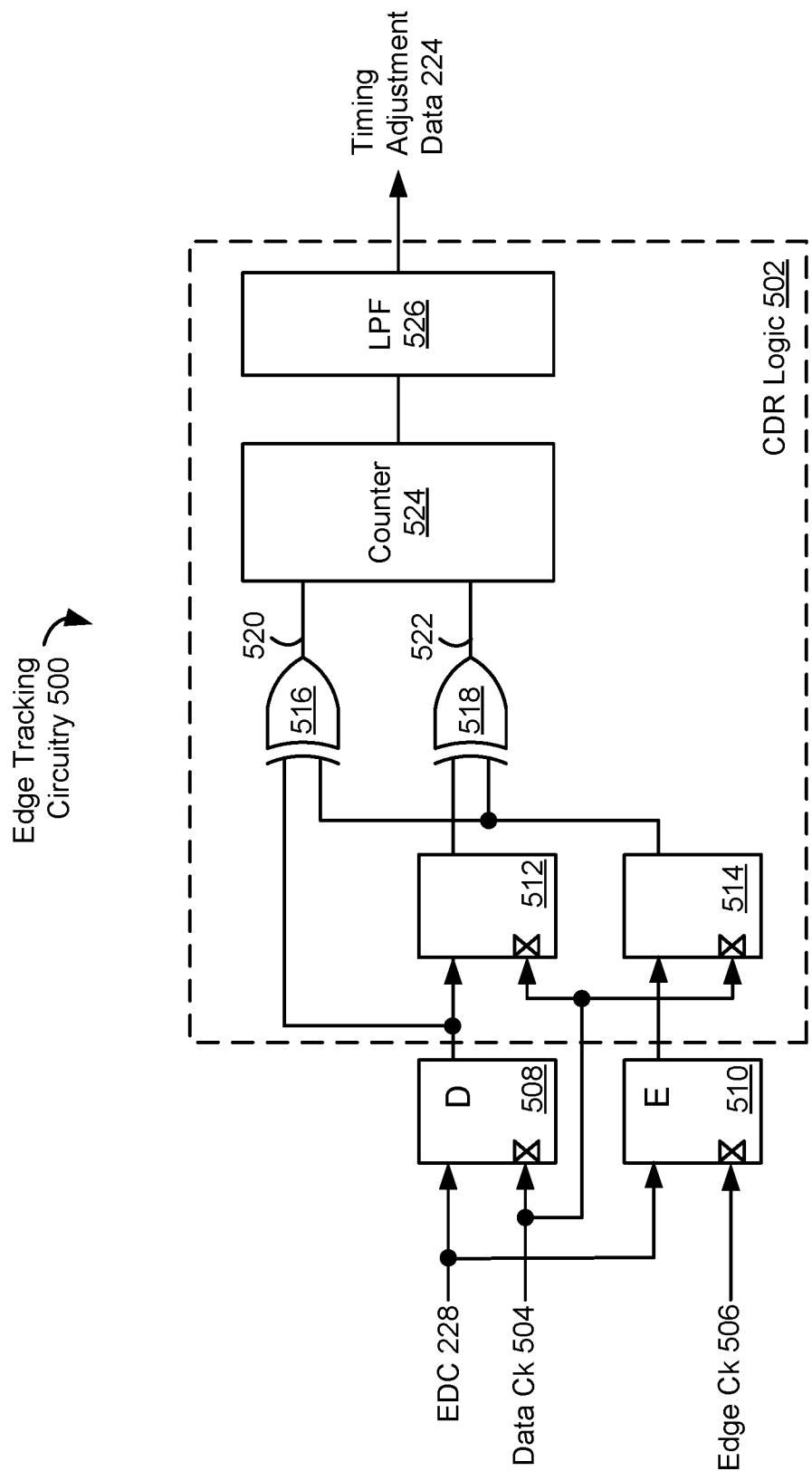
FIG. 5 is a circuit diagram of edge tracking circuitry implemented using bang-bang CDR logic in accordance with some embodiments.
Figure 6A:
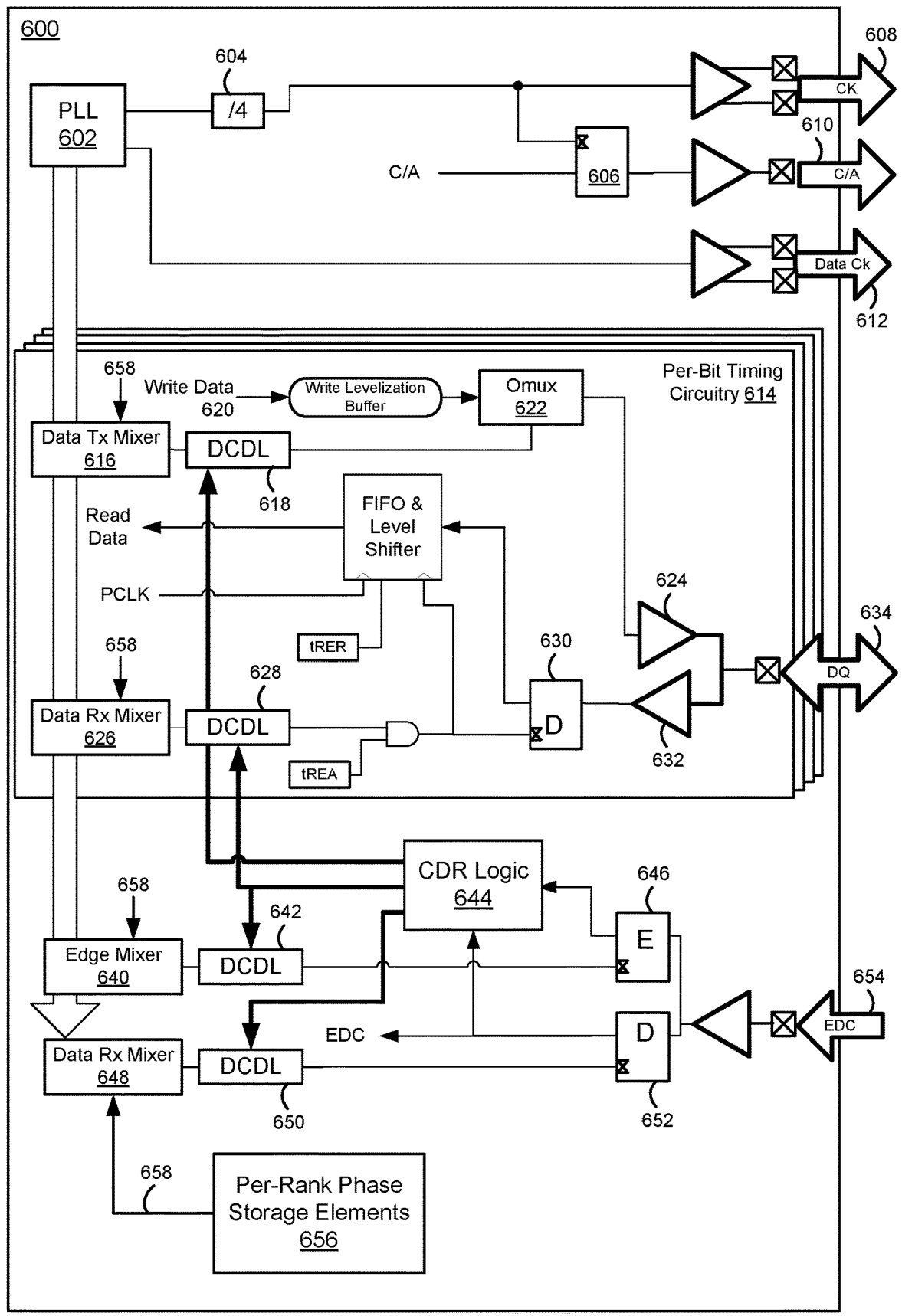
FIG. 6A is a circuit diagram of data communication circuitry in a memory controller in accordance with some embodiments.

FIG. 5 is a circuit diagram of edge tracking circuitry 500 as implemented using bang-bang CDR logic including an Alexander phase detector, in accordance with some embodiments. FIG. 5 is merely one example of an implementation of the edge tracking circuitry 226 (FIGS. 2A-2B); other implementations (e.g., using different CDR logic) are possible. The EDC signal 228 is supplied to a first flip-flop 508 and a second flip-flip 510. The first flip-flop is clocked by a data clock 504 (e.g., the second clock signal 214, FIGS. 2A-2B) and the second flip-flop is clocked by an edge clock 506 that is offset with respect to the data clock 504 by an amount corresponding to a difference between the center and edge of the EDC signal 228. For example, in a single data rate (SDR) system, the data clock 504 and edge clock 506 are out of phase by 180°, while in a double data rate (DDR) system, the data clock 504 and edge clock 506 are out of phase by 90°. The first and second flip-flops 508 and 510 are coupled to third and fourth flip-flops 512 and 514 and XOR gates 516 and 518 as shown, in an arrangement known as an Alexander phase detector. The outputs 520 and 522 of the XOR gates 516 and 518 provide an indication of whether the EDC signal is early or late and direct a counter 524 to either increment or decrement its value accordingly. The value of the counter 524, as filtered by a low-pass filter (LPF) 526, is the timing adjustment data 224 (FIGS. 2A-2B). In some embodiments, the LPF 526 filters the counter 524 by filtering out one or more least-significant bits of the value in the counter 524. The flip-flops 508 and 510 are examples of the flip-flops 652 and 646 (FIG. 6A). The flip-flops 512 and 514, XOR gates 516 and 518, counter 524, and LPF 526 constitute CDR logic 502, which is an example of the CDR logic 644 (FIG. 6A)

Figure 6B:
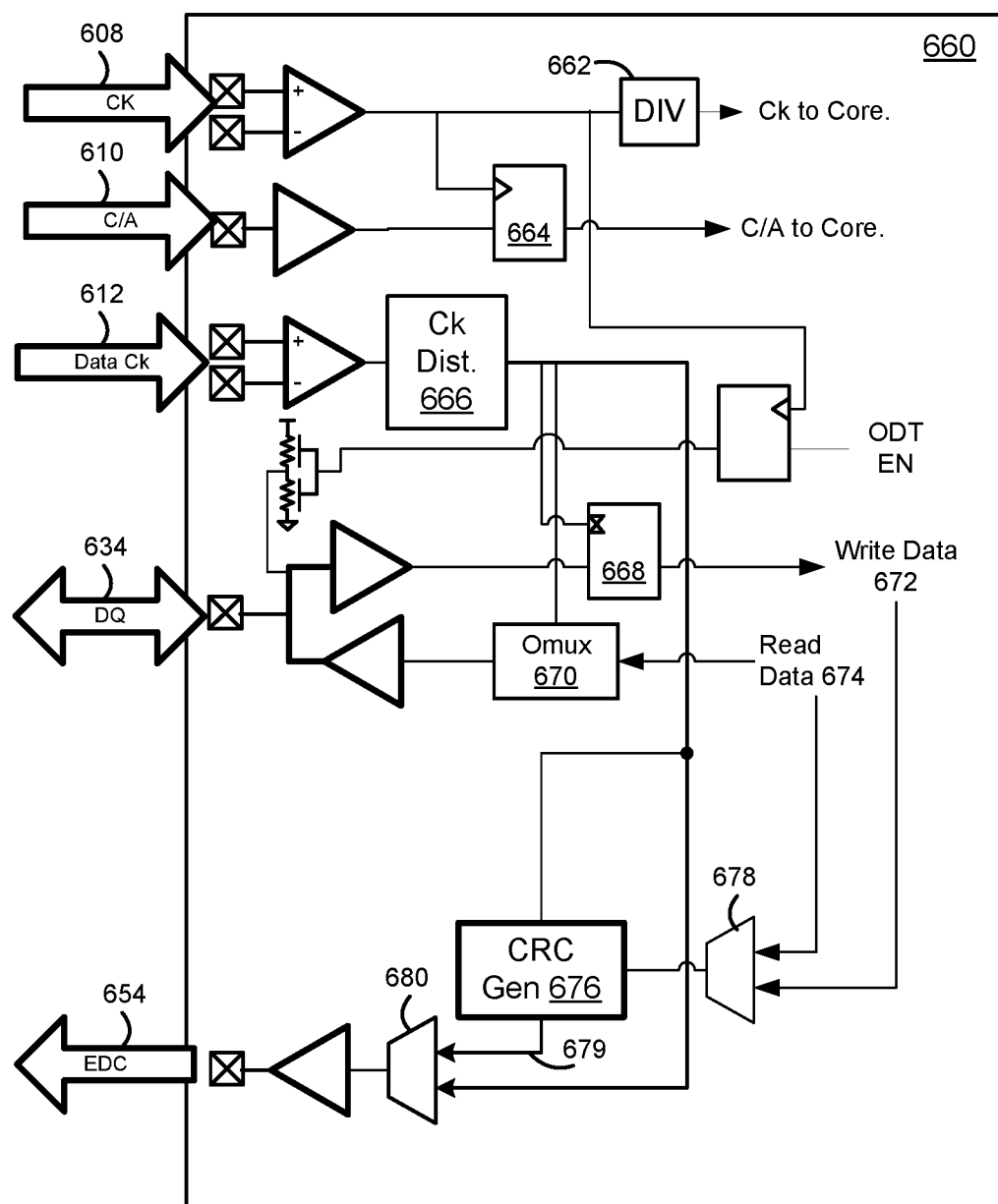
FIG. 6B is a circuit diagram of data communication circuitry in a memory device in accordance with some embodiments.

FIG. 6A illustrates data communication circuitry 600 in a memory controller 102 in accordance with some embodiments. A PLL 602, which is an example of a clock generator 202 (FIGS. 2A-2C, 3A-3B) generates a first clock signal ("Data ck") 612 that is transmitted to a memory device 104 (e.g., as illustrated in FIG. 6B) in a selected rank 106 of a slice 110. The first clock signal as generated by the PLL 602 also is provided to a clock divider 604, which divides the first clock signal (e.g., by a factor of four). The divided clock signal 608 is transmitted to the memory device 104 and is provided to a flip-flop 606 to time transmission of C/A signals 610 to the memory device 104.

The circuitry 600 includes one instance of timing circuitry 614 for each data line in a lane 108, and thus for each bit. The data lines in the lane 108 constitute a DQ bus 634. In the timing circuitry 614, a data transmission phase mixer 616 receives the first clock signal from the PLL 602 and provides an intermediate clock signal to a DCDL 618, which provides a second clock signal to an output multiplexer ("OMux") 622. The OMux 622 serializes write data 620 and drives the serialized write data onto a data line of the DQ bus 634, via an amplifier 624, in accordance with the second clock signal from the DCDL 618. The OMux 622 thus is synchronized to the second clock signal from the DCDL 618, which times transmission of the write data 620 to the memory device 104. The data transmission phase mixer 616 is an example of the phase mixer 208 (FIG. 2A) and the DCDL 618 is an example of the DCDL 212 (FIG. 2A). The data transmission phase mixer 616 and DCDL 618 together are an example of the timing circuit 302 in FIG. 3A, and the OMux 622, together with the amplifier 624, is an example of the transmitter 306 in FIG. 3A.

Also in the timing circuitry 614, a data receiver phase mixer 626 receives the first clock signal from the PLL 602 and provides an intermediate clock signal to a DCDL 628, which provides a second clock signal to a flip-flop 630. The flip-flop 630 samples data received from a data line of the DQ bus 634 as amplified by an amplifier 632. This sampling is performed in accordance with the second clock signal from the DCDL 628. The flip-flop 630 thus is synchronized to the second clock signal from the DCDL 628, which times receipt of read data from the memory device 104. The data receiver phase mixer 626 is an example of the phase mixer 208 (FIG. 2A) and the DCDL 628 is an example of the DCDL 212 (FIG. 2A). The data receiver phase mixer 626 and DCDL 628 together are an example of the timing circuit 302 in FIG. 3B, and the flip-flop 630 is an example of the sampling circuit 312 in FIG. 3B.

The circuitry 600 connects to an EDC signal line 654 that receives an EDC signal 228 (FIGS. 2A-2C) from the memory device 104 in the selected rank 106 and the slice 110. The received EDC signal 228 is provided to a first flip-flop 652 and a second flip-flop 646, which correspond to the first and second flip-flops 508 and 510 (FIG. 5). The first flip-flop 652 is clocked by a clock signal generated by a data receiver phase mixer 648 together with a DCDL 650, while the second flip-flop 646 is clocked by a clock signal generated by an edge receiver phase mixer 640 together with a DCDL 642. These clock signals are offset as described for the data and edge clocks 504 and 506 (FIG. 5). The phase mixers 640 and 648 both receive as input the first clock signal generated by the PLL 602. The first and second flip-flops 652 and 646 provide their output to CDR logic circuitry 644 (e.g., CDR logic 502, FIG. 5), which generates timing adjustment data and provides the timing adjustment data to the DCDLs 618, 628, 642, and 650. In some embodiments, the CDR logic circuitry 644 includes a low-pass filter (e.g., LPF 526, FIG. 5) to filter the timing adjustment data. The phase mixers 640 and 648, DCDLs 642 and 650, CDR logic 644, and flip-flops 646 and 652 together constitute an example of the edge tracking circuitry 226 (FIGS. 2A-2B).

The circuitry 600 includes per-rank phase storage elements 656, which are examples of the storage elements 218 (FIGS. 2A-2C). In some embodiments, the storage elements 656 are implemented as shown for the storage elements 400 (FIG. 4A) or 420 (FIG. 4B). The storage elements provide rank-specific calibration data 658 to each of the phase mixers 616, 626, 640, and 648. The phase mixers 616, 626, 640, and 648 thus adjust the phase of the first clock signal from the PLL 602 based on the calibration data 658, and the DCDLs 618, 628, 642, and 650 adjust the phase of the clock signal output by respective phase mixers 616, 626, 640, and 648 based on timing adjustment data from the CDR logic 644. In some embodiments, the storage elements 656 include separate storage elements for read and write calibration data, such that the data transmission phase mixer 616 receives calibration data 658 that is separate from the calibration data received by the data receiver phase mixers 626 and 648 and edge phase mixer 640.

FIG. 6B illustrates data communication circuitry 660 in a memory device 104 (FIG. 1) in accordance with some embodiments. The clock signal 608 from the memory controller 102 is divided by a divider 662 and provided to the memory core to time operations within the memory device 104. The C/A signal 610 from the memory controller 102 is sampled by a sampling circuit 664, as clocked by the clock signal 608, and provided to the core for processing. The first clock signal 612 from the memory controller 102 is distributed, via clock distribution circuitry 666, to circuitry including a sampling circuit 668, an output multiplexer 670, a cycle redundancy check (CRC) generator 676, and a multiplexer 680. The sampling circuit 668, as clocked by the clock signal 612, samples write data received from a respective data line of the DQ bus 634 and forwards the sampled write data 672 to the memory core. The output multiplexer 670, as clocked by the clock signal 612, serializes read data 674 received from the memory core and transmits the serialized read data onto the respective data line of the DQ bus 634. The multiplexer 678 provides either the read data 674 or the sampled write data 672 to the CRC generator 676, which generates a CRC signal 679 from the provided data. The CRC generator 676 is clocked by the clock signal 612. The multiplexer 680 transmits either the CRC signal 679 or the clock signal 612 (e.g., when the memory device 104 is selected but idle) as the EDC signal 654. FIG. 6B thus illustrates that the memory device 104 uses a clock signal 612 received from the memory controller 102 to time communications with the memory controller 102, and does not include a PLL or DLL.

Attention is now directed to methods of controlling memory devices. FIG. 7A is a flow diagram illustrating a method 700 of controlling memory devices in accordance with some embodiments. The method 700 is performed (702) at (and by) a memory controller 102 (FIG. 1) coupled to memory devices 104 in a plurality of ranks 106, including a first memory device in a first rank (e.g., rank 106a, FIG.

1) and a second memory device in a second rank (e.g., rank 106b, FIG. 1). The memory devices 104, including first and second memory devices 104, are situated in the same slice 110.

In the method 700, a first clock signal is generated (704). In some embodiments, the first clock signal includes (706) a first plurality of phase vectors. For example, the clock generator 202 (FIGS. 2A-2C, 3A-3B) generates a clock signal 204 that includes a plurality of phase vectors.

A phase of the first clock signal is adjusted (708) to generate a second clock signal (e.g., Ck 214, FIGS. 2A-2B; clock signal 210, FIG. 2C), based on calibration data associated with the second memory device 104 and timing adjustment data associated with feedback from at least the first memory device. For example, the phase of the first clock signal is adjusted based on calibration data stored in a respective storage element of the plurality of storage elements 218 (FIGS. 2A-2C) that corresponds to the second memory device 104, and also based on timing adjustment data 224 (FIGS. 2A-2B) calculated based on the EDC signal 228 received from the first memory device 104, with which the memory controller was communicating prior to communicating with the second memory device 104. The timing adjustment data 224 based on feedback from the first memory device 104 thus is applied to communication with the second memory device 104 after the controller 102 switches from communicating with the first memory device 104 to communicating with the second memory device 104. In some embodiments, the feedback includes (710) feedback from the first and second memory devices 104. For example, after the controller 102 switches from communicating with the first memory device 104 to communicating with the second memory device 104, the timing adjustment data 224 is based both on the feedback from the first memory device 104 and newly received feedback (e.g., in the form of the EDC signal 228) from the second memory device 104. In another example, the phase of the first clock signal is adjusted based on calibration data stored in a respective storage element of the plurality of storage elements 218 (FIG. 2C), as updated based on the timing adjustment data.

Communications with the second memory device 104 are timed (712) in accordance with the second clock signal (e.g., Ck 214, FIGS. 2A-2B; clock signal 210, FIG. 2C). In some embodiments, a transmitter (e.g., transmitter 306, FIG. 3A; OMux 622, FIG. 6A) transmitting data (e.g., data 308/310, FIG. 3A) to the second memory device is clocked (714) with the second clock signal (e.g., clock signal 304, FIG. 3A). In some embodiments, a sampling circuit (e.g., sampling circuit 312, FIG. 3B; flip-flop 630, FIG. 6A) receiving data (e.g., data 314/316, FIG. 3B) from the second memory device is clocked with the second clock signal (e.g., clock signal 304, FIG. 3B).

Figure 7B:
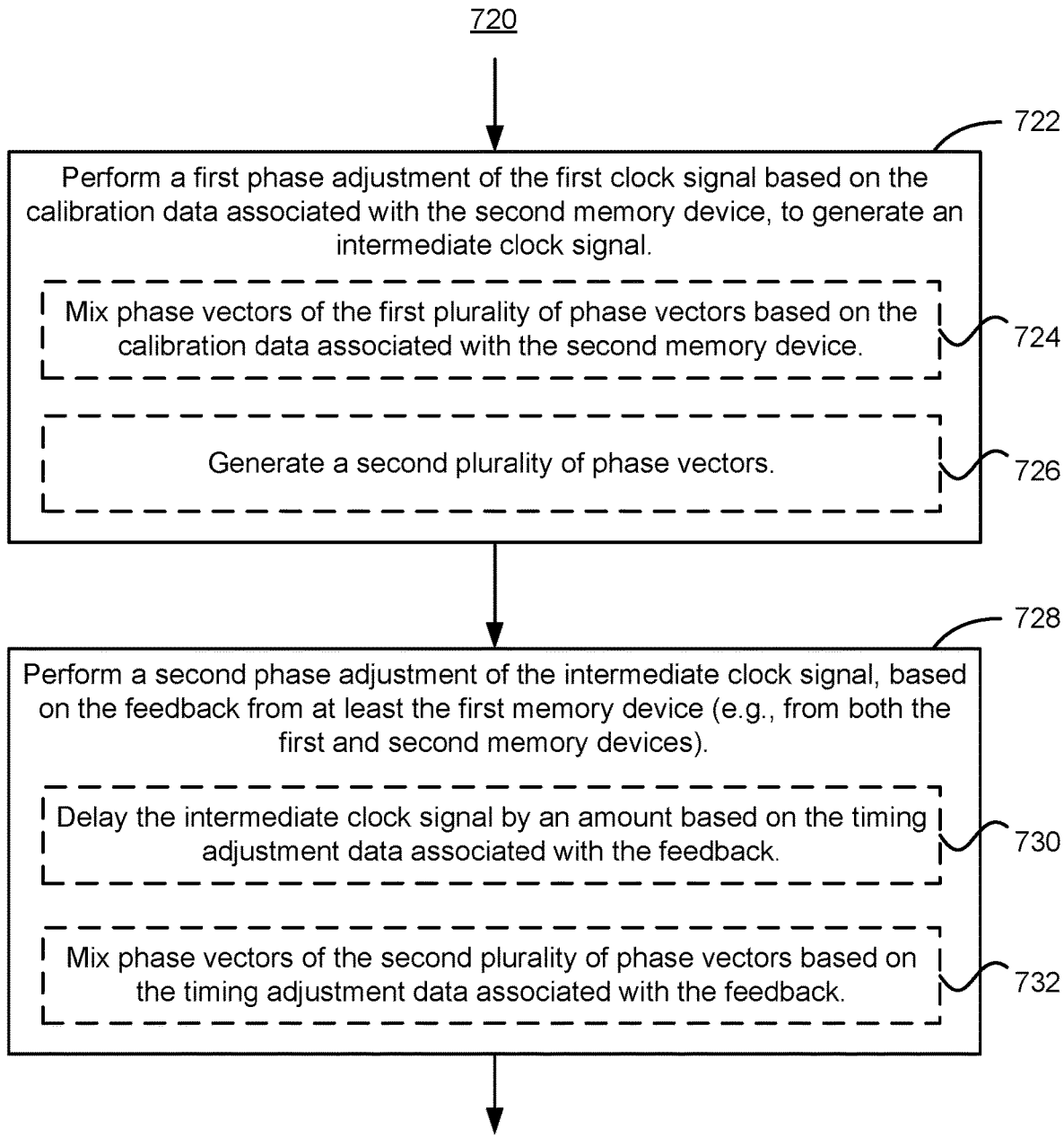

FIG. 7B is a flow diagram illustrating a method 720 of adjusting the phase of the first clock signal in the operation 708 of the method 700 (FIG. 7A), in accordance with some embodiments. In the method 720, a first phase adjustment of the first clock signal is performed (722) based on the calibration data (e.g., calibration data 216, FIGS. 2A-2B) associated with the second memory device 104, to generate an intermediate clock signal (e.g., intermediate clock signal 210, FIG. 2A, or 244, FIG. 2B). In some embodiments in which the first clock signal includes (706, FIG. 7A) the first plurality of phase vectors, performing the first phase adjustment includes mixing (724) phase vectors of the first plurality of phase vectors based on the calibration data associated with the second memory device 104. For example, the phase mixer 208 (FIG. 2A) or 242 (FIG. 2B) mixes phase vectors of the first plurality of phase vectors. In some embodiments, in which the intermediate clock signal includes a second plurality of phase vectors (e.g., the phase vectors of the intermediate clock signal 244, FIG. 2B), generating the second clock signal includes generating the second plurality of phase vectors (726).

A second phase adjustment of the intermediate clock signal is performed (728) based on the feedback from at least the first memory device 104 (e.g., from both the first and second memory devices 104) to generate the second clock signal. In some embodiments, performing the second phase adjustment includes delaying (730) the intermediate clock signal by an amount based on the timing adjustment data associated with the feedback. For example, the DCDL 212 (FIG. 2A) delays the intermediate clock signal 210 based on the timing adjustment data 224. Alternatively, in some embodiments in which the intermediate clock signal includes (726) a second plurality of phase vectors, phase vectors of the second plurality of phase vectors are mixed (732) based on the timing adjustment data associated with the feedback. For example, the phase mixer 246 (FIG. 2B) mixes phase vectors of the plurality 244 based on the timing adjustment data 224 to generate the second clock signal.

Figure 7C:
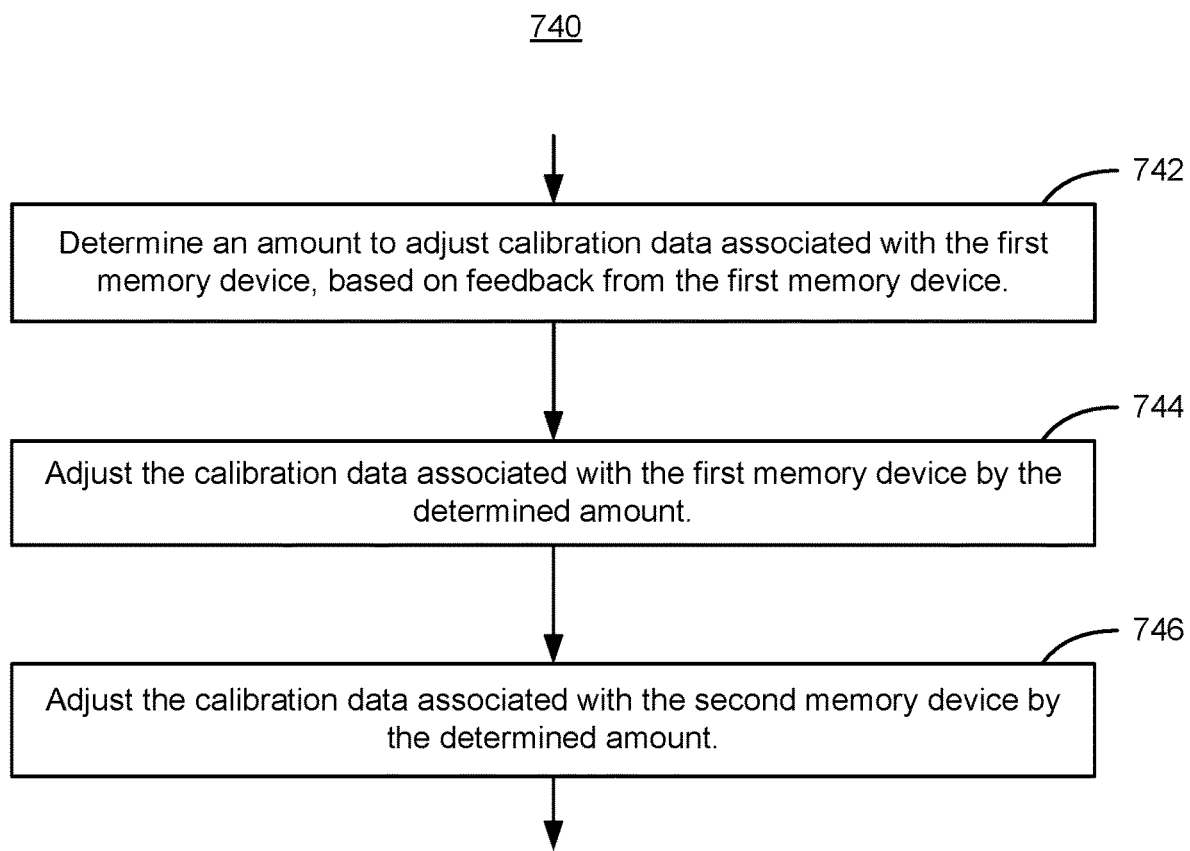

FIG. 7C is a flow diagram illustrating a method 740 to be performed along with the method 700 (FIG. 7A), in accordance with some embodiments. In the method 740, an amount to adjust calibration data associated with the first memory device 104 is determined (742), based on feedback from the first memory device 104. The calibration data associated with the first memory device is adjusted (744) by the determined amount. The calibration data associated with the second memory device is also adjusted (746) by the determined amount. For example, as illustrated in FIGS. 4A and 4B, the calibration data stored in each of the registers 220a through 220n (FIG. 4A), or in each of the counters 422a through 422n (FIG. 4B), are updated by the same amount, which may be determined based on feedback from a single memory device 104. After the method 740 has been performed, the adjusted calibration data associated with the second memory device 104 is used in the operation 708 of the method 700 (FIG. 7A).

In some embodiments, when the memory controller subsequently communicates with the second memory device 104, additional timing adjustments are determined based on newly received feedback from the second memory device 104 and the second timing is modified based on the additional timing adjustments. For example, the DCDL 212 (FIG. 2A) or phase mixer 246 (FIG. 2B) makes the additional timing adjustments. Alternatively, the calibration data 216 for the second memory device 104 is further updated based on the additional timing adjustments.

While the methods 700, 720, and/or 740 include a number of operations that appear to occur in a specific order, it should be apparent that the methods 700, 720, and/or 740 can include more or fewer operations, some of which can be executed serially or in parallel. An order of two or more operations may be changed and two or more operations may be combined into a single operation.

Figure 7D:
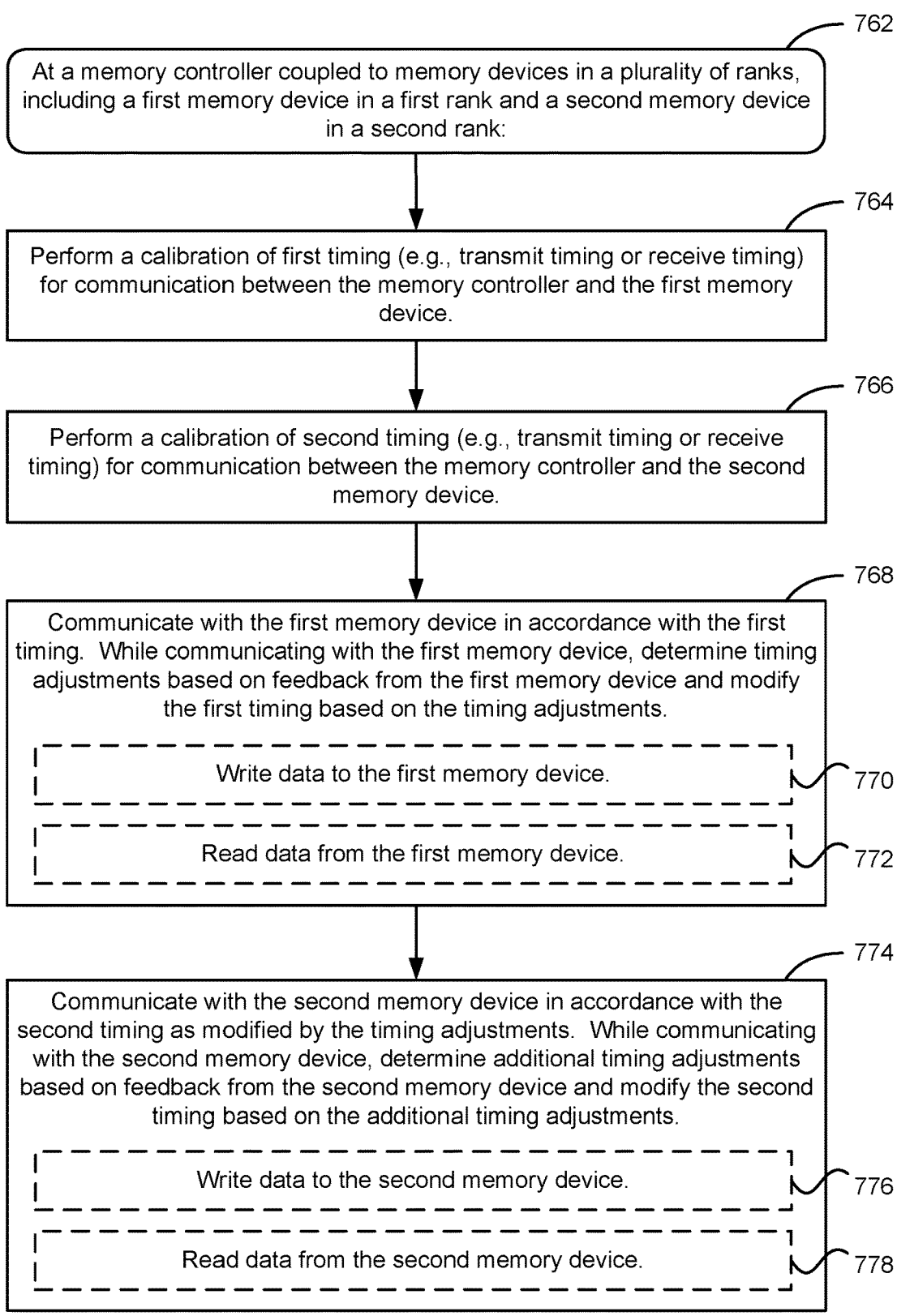

FIG. 7D is a flow diagram illustrating a method 760 of controlling memory devices 104 in accordance with some embodiments. The method 760 is performed (762) at and by a memory controller 102 (FIG. 1) coupled to memory devices 104 in a plurality of ranks 106, including a first memory device 104 in a first rank (e.g., rank 106a, FIG. 1) and a second memory device 104 in a second rank (e.g., rank 106b, FIG. 1). The memory devices 104, including first and second memory devices 104, are situated in the same slice 110.

In the method 760, a calibration of first timing (e.g., transmit timing or receive timing, or write or read timing) is performed (764) for communication between the memory controller 102 and the first memory device 104. A calibration of second timing (e.g., transmit timing or receive timing) is performed (766) for communication between the memory controller 102 and the second memory device 104. These calibrations are performed, for example, using the calibration circuitry 230 (FIGS. 2A-2C), and the resulting calibration data is stored in the plurality of storage elements 218 (FIGS. 2A-2C). In some embodiments, these calibrations are performed upon powering on the memory controller 102, after a reset operation, and/or after no communication has occurred between the memory controller 102 and the first and second memory devices 104 for a specified period of time.

Communication with the first memory device 104 is performed (768) in accordance with the first timing (e.g., in accordance with the calibration data 216 for the first memory device 104 as stored in a respective storage element of the plurality 218 and provided to the phase mixer 208 or 242, FIGS. 2A-2C). While communicating with the first memory device 104, timing adjustments are determined based on feedback from the first memory device 104 and the first timing is modified based on the timing adjustments. For example, the edge tracking circuitry 226 (FIGS. 2A-2B) determines timing adjustment data 224, and the DCDL 212 (FIG. 2A) or phase mixer 246 (FIG. 2B) makes timing adjustments using the timing adjustment data 224. The timing adjustments are thus based on feedback from the first memory device 104. Alternatively, updates to the calibration data 216 for the first memory device 104 are made (e.g., by the calibration circuitry 230 or edge tracking circuitry 226) based on feedback from the first memory device 104.

In some embodiments, communicating with the first memory device 104 includes writing data (770) to the first memory device 104 (e.g., using the transmitter 306, FIG. 3A). In some embodiments, communicating with the first memory device 104 includes reading data (772) from the first memory device 104 (e.g., using the sampling circuit 312, FIG. 3B).

Communication with the second memory device 104 is performed (774) in accordance with the second timing as modified by the timing adjustments. For example, the communication is performed in accordance with the calibration data 216 for the second memory device 104 as stored in a respective storage element of the plurality 218 and provided to the phase mixer 208 or 242 (FIGS. 2A-2C). In some embodiments, the DCDL 212 (FIG. 2A) or phase mixer 246 (FIG. 2B) makes the timing adjustments based on the timing adjustment data 224. Alternatively, the calibration data 216 for the second memory device 104 has been updated based on timing adjustment data for the first memory device 104. While communicating with the second memory device 104, additional timing adjustments are determined based on newly received feedback from the second memory device 104 and the second timing is modified based on the additional timing adjustments. For example, the DCDL 212 (FIG. 2A) or phase mixer 246 (FIG. 2B) makes the additional timing adjustments. Alternatively, the calibration data 216 for the second memory device 104 is further updated based on the additional timing adjustments.

In some embodiments, communicating with the second memory device 104 includes writing data (776) to the second memory device 104 (e.g., using the transmitter 306, FIG. 3A). In some embodiments, communicating with the second memory device 104 includes reading data (778) from the second memory device 104 (e.g., using the sampling circuit 312, FIG. 3B).

In some embodiments, the feedback from the first and second memory devices 104 includes respective EDC signals 228 (FIGS. 2A-2C) from the first and second memory devices 104. In some embodiments, the feedback from the first and second memory devices 104 includes respective read strobes from the first and second memory devices 104. The feedback from the first and second memory devices 104 varies based on voltage and temperature changes for the first and second memory devices 104, and thus allows the controller 102 to update its timing based on voltage and temperature variations.

While the method 760 includes a number of operations that appear to occur in a specific order, it should be apparent that the method 760 can include more or fewer operations, which can be executed serially or in parallel. An order of two or more operations (e.g., operations 764 and 766) may be changed and two or more operations may be combined into a single operation.

The foregoing description, for purpose of explanation, has been described with reference to specific embodiments. However, the illustrative discussions above are not intended to be exhaustive or to limit the inventions to the precise forms disclosed. Many modifications and variations are possible in view of the above teachings. The embodiments were chosen and described in order to best explain the principles of the inventions and their practical applications, to thereby enable others skilled in the art to best utilize the inventions and various embodiments with various modifications as are suited to the particular use contemplated.

What is claimed is:

1. A memory controller to control the operation of a first memory device and a second memory device, the memory controller comprising:
   a first register to store a first phase value for receiving data from the first memory device;
   a second register to store a second phase value for receiving data from the second memory device;
   a timing circuit to derive the first phase value based on first calibration data associated with the first memory device, wherein the first calibration data is to be established based on a strobe signal received from the first memory device via a respective strobe signal line, and to derive the second phase value based on second calibration data associated with the second memory device, wherein the second calibration data is to be established based on a strobe signal received from the second memory device via a respective strobe signal line; and
   a sampling circuit, coupled to the timing circuit and at least one signal line, to receive data based on the first phase value and the second phase value.

2. The memory controller of claim 1, wherein the timing circuit includes edge tracking circuitry coupled to the first register and second register to generate first timing adjustment data associated with the first memory device and second timing adjustment data associated with the second memory device.

3. The memory controller of claim 2, wherein the edge tracking circuitry is configured to provide the first timing adjustment data to the first register and to provide the second timing adjustment data to the second register.

4. The memory controller of claim 1, wherein the timing circuit includes EDC sampling circuitry to sample a signal from the first memory device with a first clock and with a second clock having a predefined phase offset from the first clock to produce samples of the signal from the first memory device; edge tracking circuitry to produce a timing adjustment signal, based on the samples of the signal from the first memory device, indicating whether the signal from the first memory device is early or late; and adjustment circuitry for updating the first calibration data and second calibration data based on the timing adjustment signal.

5. The memory controller of claim 1, further comprising a clock generator to generate a first signal; and
wherein the timing circuit is to generate a second signal from the first signal to time data transfer communications with the first and second memory devices, the timing circuit to adjust a phase of the first signal to generate the second signal when the memory controller transitions from a data transfer communication with the first memory device to a data transfer communication with the second memory device, the second signal having a phase that is based on the second phase value stored in the second register.

6. The memory controller of claim 5, wherein
the timing circuit includes a first phase adjuster to generate an intermediate signal by adjusting a phase of the first signal, and a second phase adjuster to generate the second signal by adjusting a phase of the intermediate signal.

7. The memory controller of claim 6, wherein the second phase adjuster is to delay the intermediate signal by an amount based on feedback received from the first memory device when the memory controller directs data transfer communications with the first memory device, and by an amount based on feedback received from the second memory device when the memory controller directs data transfer communications with the second memory device.

8. The memory controller of claim 6, wherein the second phase adjuster is to adjust the phase of the intermediate signal by a timing adjustment amount based on feedback received from the first memory device during data transfer communications with the first memory device, and is to continue to adjust the phase of the intermediate signal using the timing adjustment amount associated with communicating with the first memory device initially after the memory controller transitions from data transfer communications with the first memory device to data transfer communications with the second memory device.

9. The memory controller of claim 1, further comprising:
calibration circuitry to generate the first phase value stored in the first register and the second phase value stored in the second register;
wherein the calibration circuitry is to send a calibration data pattern to the first memory device and the second memory device, to determine the first phase value for the first memory device based on a signal from the first memory device and to determine the second phase value for the second memory device based on a signal from the second memory device.

10. The memory controller of claim 1, further comprising:
adjustment circuitry to adjust the first phase value stored in the first register and adjust the second phase value in the second register in accordance with a same update amount.

11. The memory controller of claim 10, wherein the update amount corresponds to voltage and temperature drift experienced by the first memory device and second memory device.

12. The memory controller of claim 1, wherein the sampling circuit is to receive data from the first memory device based on the first phase value, and to receive data from the second memory device based on the second phase value.

13. The memory controller of claim 1, further comprising a transmitter, coupled to the timing circuit, to transmit data to the first memory device in accordance with the first phase value and to transmit data to the second memory device in accordance with the second phase value.

14. A method of controlling memory devices, comprising:
at a memory controller coupled to a first memory device and a second memory device:
storing in a first register a first phase value for data communications with the first memory device;
storing in a second register a second phase value for data communications with the second memory device;
deriving the first phase value based on first calibration data associated with the first memory device, wherein the first calibration data is to be established based on a strobe signal received from the first memory device via a respective strobe signal line, and deriving the second phase value based on second calibration data associated with the second memory device, wherein the second calibration data is to be established based on a strobe signal received from the second memory device via a respective strobe signal line;
receiving data from the first memory device based on the first phase value; and
receiving data from the second memory device based on the second phase value.

15. The method of claim 14, including sampling a signal from the first memory device with a first clock and with a second clock having a predefined phase offset from the first clock to produce samples of the signal from the first memory device; producing a timing adjustment signal, based on the samples of the signal from the first memory device, indicating whether the signal from the first memory device is early or late; and updating the first calibration data and second calibration data based on the timing adjustment signal.

16. The method of claim 14, further comprising:
generating a first signal; and
generating a second signal from the first signal to time data transfer communications with the first and second memory devices, including adjusting a phase of the first signal to generate the second signal when the memory controller transitions from a data transfer communication with the first memory device to a data transfer communication with the second memory device, the second signal having a phase that is based on the second phase value stored in the second register.

17. The method of claim 16, wherein generating the second signal includes:
generating an intermediate signal using a first phase adjuster, and generating the second signal from the first signal using a second phase adjuster to adjust the phase of the first signal.

18. The method of claim 17, wherein generating the second signal includes:

generating the intermediate signal by adjusting a phase of the first signal; and adjusting a phase of the intermediate signal to generate the second signal, the adjusting of the phase of the intermediate signal including: delaying the intermediate signal by an amount based on feedback received from the first memory device when the memory controller directs data transfer communications with the first memory device, and by an amount based on feedback received from the second memory device when the memory controller directs data transfer communications with the second memory device.

19. The method of claim 17, wherein generating the second signal includes:

generating the intermediate signal by adjusting a phase of the first signal; and adjusting a phase of the intermediate signal to generate the second signal, the adjusting of the phase of the intermediate signal including: delaying the intermediate signal by a timing adjustment amount based on feedback received from the first memory device when the memory controller directs data transfer communications with the first memory device, and continuing to adjust the phase of the intermediate signal using the timing adjustment amount associated with communicating with the first memory device initially after the memory controller transitions from data transfer communications with the first memory device to data transfer communications with the second memory device.

20. A memory controller to control the operation of a first memory device coupled to the memory controller via at least one signal line, and a second memory device coupled to the memory controller via the at least one signal line, the memory controller comprising:

a first register to store a first phase value for data communications with the first memory device;

a second register to store a second phase value for data communications with the second memory device;

a timing circuit to derive a first phase value based on first calibration data associated with the first memory device and second calibration data associated with the second memory device, the timing circuit including circuitry to receive a strobe signal from the first memory device via a respective strobe signal line and receive a strobe signal from the second memory device via a respective strobe signal line; and adjustment circuitry to adjust the first phase value stored in the first register and adjust the second phase value in the second register in accordance with a same update amount; and a sampling circuit, coupled to the timing circuit and at least one signal line, to receive data from the first memory device using a timing phase that is based on the first phase value.

* * * * *